United States Patent
Pekny et al.

(10) Patent No.: US 8,233,322 B2
(45) Date of Patent: Jul. 31, 2012

(54) MULTI-PARTITION MEMORY WITH SEPARATED READ AND ALGORITHM DATALINES

(75) Inventors: Theodore T. Pekny, Milpitas, CA (US); Stephen J. Gualandri, Campbell, CA (US)

(73) Assignee: Micron Technology, Inc., Boise, ID (US)

( * ) Notice: Subject to any disclaimer, the term of this patent is extended or adjusted under 35 U.S.C. 154(b) by 559 days.

(21) Appl. No.: 10/683,075

(22) Filed: Oct. 10, 2003

(65) Prior Publication Data

US 2005/0081013 A1 Apr. 14, 2005

(51) Int. Cl.
*G11C 16/04* (2006.01)
(52) U.S. Cl. .......... 365/185.11; 365/189.04; 365/230.03
(58) Field of Classification Search .............. 365/185.11, 365/51, 63, 189.04, 189.08, 230.03
See application file for complete search history.

(56) References Cited

U.S. PATENT DOCUMENTS

| | | | | |
|---|---|---|---|---|
| 5,570,319 | A * | 10/1996 | Santoro et al. | 365/230.03 |
| 5,675,529 | A * | 10/1997 | Poole | 365/63 |
| 5,847,994 | A * | 12/1998 | Motoshima et al. | 365/185.11 |
| 5,894,437 | A * | 4/1999 | Pellegrini | 365/185.13 |
| 6,058,461 | A | 5/2000 | Lewchuk et al. | |
| 6,292,392 | B1 * | 9/2001 | Fukui | 365/185.11 |
| 6,480,929 | B1 | 11/2002 | Gauthier et al. | |
| 6,529,409 | B1 | 3/2003 | Nguyen et al. | |
| 6,587,917 | B2 | 7/2003 | Simmons | |
| 6,614,685 | B2 | 9/2003 | Wong | |
| 6,643,212 | B1 | 11/2003 | Jones, Jr. et al. | |
| 6,822,900 | B2 * | 11/2004 | Kamei | 365/185.11 |
| 6,829,194 | B2 * | 12/2004 | Honda et al. | 365/226 |

\* cited by examiner

*Primary Examiner* — VanThu Nguyen
(74) *Attorney, Agent, or Firm* — Leffert Jay & Polglaze, P.A.

(57) ABSTRACT

A multiple partition memory and architecture for concurrent operations reduces circuit overhead by providing a common read sense amplifier and program path for multiple partitions. Long separate datalines for read and algorithm operations allow concurrent operation and blockout of multiple operations in a single block of the memory.

25 Claims, 7 Drawing Sheets

300

| | #1 | #2 | #3 | #4 |
|---|---|---|---|---|
| Partition 3 | 31 | 63 | 95 | 127 |
| | 30 | 62 | 94 | 126 |
| | 29 | 61 | 93 | 125 |
| | 28 | 60 | 92 | 124 |
| | 27 | 59 | 91 | 123 |
| | 26 | 58 | 90 | 122 |
| | 25 | 57 | 89 | 121 |
| | 24 | 56 | 88 | 120 |
| Partition 2 | 23 | 55 | 87 | 119 |
| | 22 | 54 | 86 | 118 |
| | 21 | 53 | 85 | 117 |
| | 20 | 52 | 84 | 116 |
| | 19 | 51 | 83 | 115 |
| | 18 | 50 | 82 | 114 |
| | 17 | 49 | 81 | 113 |
| | 16 | 48 | 80 | 112 |
| | #1 | #2 SENSE AMP ROW | #3 | #4 |
| Partition 1 | 15 | 47 | 79 | 111 |
| | 14 | 46 | 78 | 110 |
| | 13 | 45 | 77 | 109 |
| | 12 | 44 | 76 | 108 |
| | 11 | 43 | 75 | 107 |
| | 10 | 42 | 74 | 106 |
| | 9 | 41 | 73 | 105 |
| | 8 | 40 | 72 | 104 |
| Partition 0 | 7 | 39 | 71 | 103 |
| | 6 | 38 | 70 | 102 |
| | 5 | 37 | 69 | 101 |
| | 4 | 36 | 68 | 100 |
| | 3 | 35 | 67 | 99 |
| | 2 | 34 | 66 | 98 |
| | 1 | 33 | 65 | 97 |
| | P0-P3 | 32 | 64 | 96 |

Logic / Analog

4 Pgm-SA rows each covering 4 partitions, 2 above & 2 below the center row.

*Fig. 4* ns or banks of flash memory. Each partition is typically a grouping of several blocks. Each block is individually accessible for program, eras, and read operations. Concurrent operation is dual operation in two different partitions simultaneously. For example, one block in one partition is being read which a different block in a different partition is being programmed or erased. Concurrency operations have been handled in the prior art by having an individual circuit for each partition, as is shown in the partition architecture 100 of FIG. 1. Partition 100 includes data sectors 102, and row drivers, column pass gates, predecoders, and timers 104. Sense amps are dedicated by partitions, and circuits 106 to program sense amplifiers for read operations and the like are all dedicated by partition. The circuits for each partition can program or read blocks in that partition. The circuits necessary for read and program operations are repeated for each partition block, such as partition blocks 202, 204, and 206 in a memory device such as device 200 shown in FIG. 2. A flash device with 16 partitions has 16 groupings of circuits, one for each partition, with each circuit individually capable of program or read operations as shown in FIG. 1.

FIG. 2 shows a memory 200 with 32 partitions. This memory 202 therefore has 32 program rows as well as 32 sense amp rows. Memories such as this can quickly become very large as density increases.

With concurrent operational memories requiring an individual circuit for each partition block, and with the increasing density of memories and therefore the increasing number of partitions and memory blocks of current memories, individual circuitry for each partition block can cause serious issues with respect to die size. Further, as memory densities continue to increase, such an architecture may effectively limit memory density to below that which is available in order to maintain die size.

For the reasons stated above, and for other reasons stated below which will become apparent to those skilled in the art upon reading and understanding the present specification, there is a need in the art for a memory architecture that reduces real estate overhead in the memory, and improving functionality while maintaining die size.

SUMMARY

The above-mentioned problems with concurrent operation in memories, increasing memory size and other problems are addressed by the present invention and will be understood by reading and studying the following specification.

In one embodiment, a multiple partition memory architecture includes a number of partitions of memory cells, a number of groups of at least two partitions, a common program path and sense path circuit for each of the groups, and multiple separate read and algorithm datalines, each of the read

MULTI-PARTITION MEMORY WITH SEPARATED READ AND ALGORITHM DATALINES

FIELD

The present invention relates generally to memories and in particular the present invention relates to memory architecture.

BACKGROUND

In flash memory products, it is common to design in functionality which supports concurrent operation between partitioand algorithm datalines spanning one of the groups and its common program path and sense path circuit.

In another embodiment, a method of reducing circuit overhead in a multiple partition memory includes providing a memory divided into a number of partitions, arranging the partitions into groups of at least two partitions, providing a common program path and sense path circuit for each of the groups, providing separate read and algorithm datalines, each of the read and algorithm datalines spanning one of the groups and its common program path and sense path circuit, and allowing a concurrent operation on any partition not already in operation.

In yet another embodiment, a processing system includes a processor and a memory coupled to the processor to store data provided by the processor and to provide data to the processor. The memory includes an array of memory cells addressable by address circuitry and input output circuitry, and control circuitry to read, write and erase the memory cells. The control circuitry includes a multiple partition memory architecture having a number of partitions of memory cells, a number of groups of at least two partitions, a common program path and sense path circuit for each of the groups, and separate read and algorithm datalines, each of the read and algorithm datalines spanning one of the groups and its common program path and sense path circuit.

Other embodiments are described and claimed.

BRIEF DESCRIPTION OF DRAWINGS

FIG. 4 is a block diagram of block placement in a memory according to another embodiment of the present invention;

DETAILED DESCRIPTION

Figure 1:
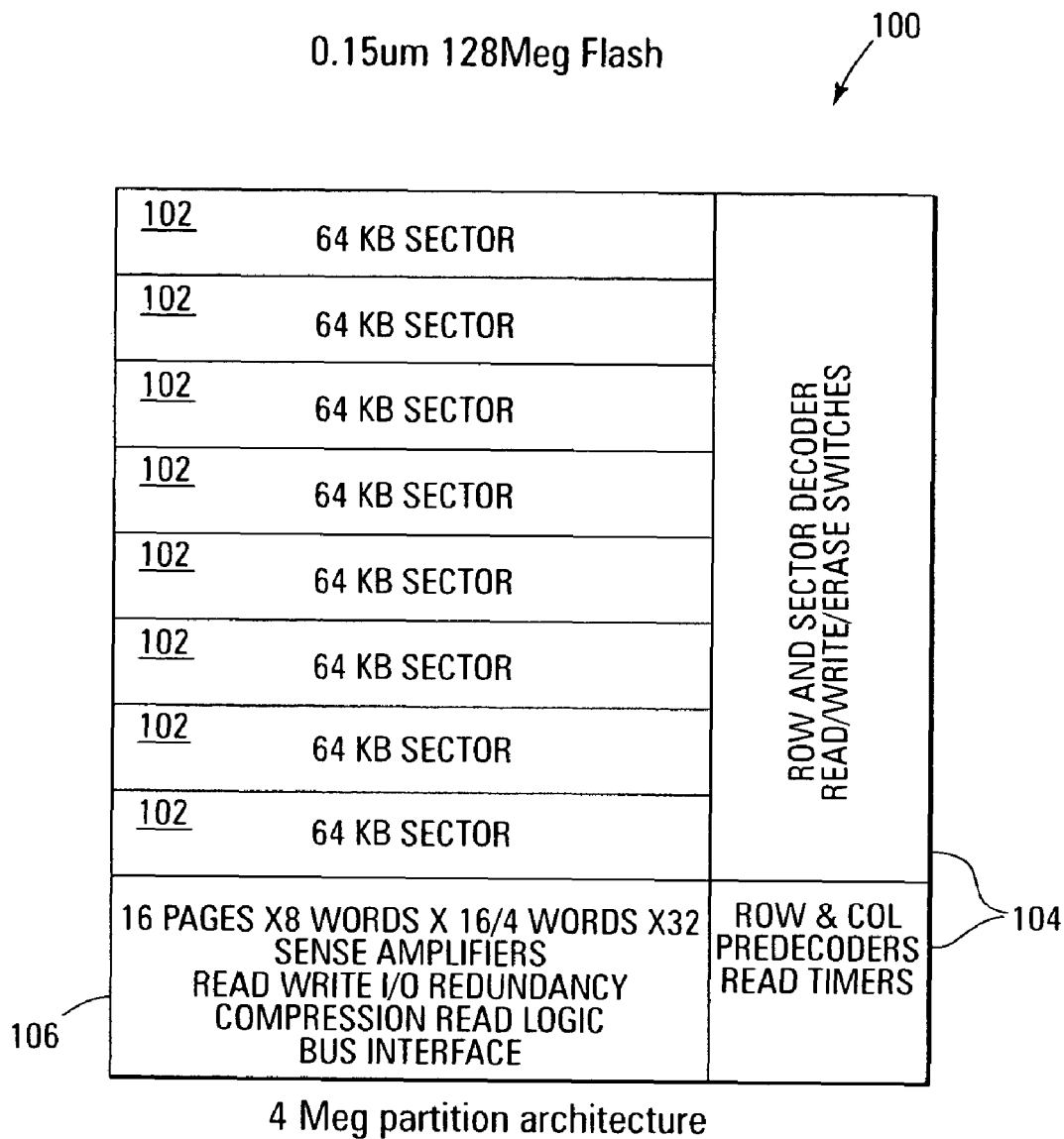
FIG. 1 is a block diagram of a typical prior art partition architecture.
Figure 2:
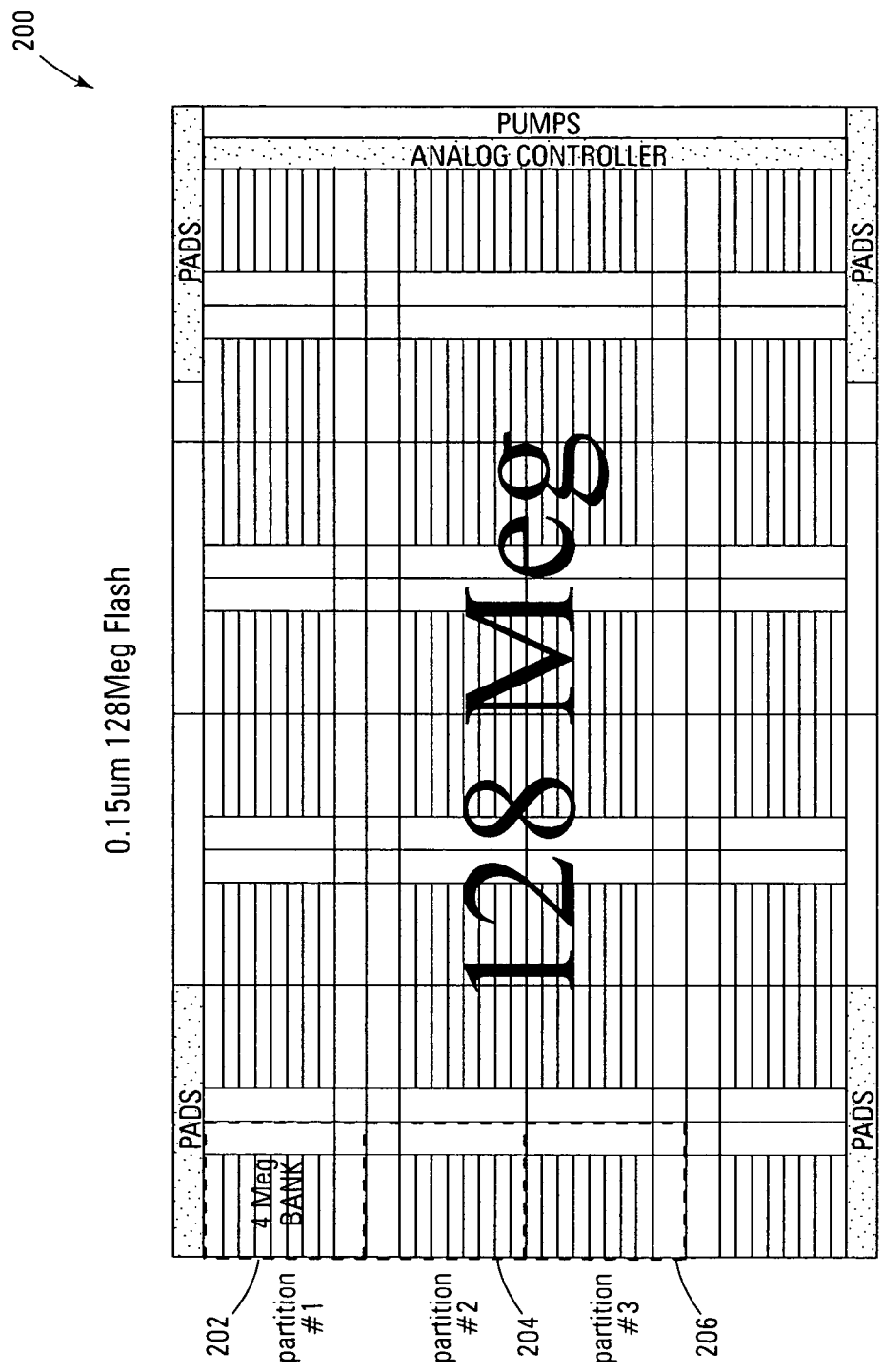
FIG. 2 is a block diagram of a typical prior art memory using the architecture of FIG. 1.

In the following detailed description of the invention, reference is made to the accompanying drawings that form a part hereof, and in which is shown, by way of illustration, specific embodiments in which the invention may be practiced. In the drawings, like numerals describe substantially similar components throughout the several views. These embodiments are described in sufficient detail to enable those skilled in the art to practice the invention. Other embodiments may be utilized and structural, logical, and electrical changes may be made without departing from the scope of the present invention.

The following detailed description is, therefore, not to be taken in a limiting sense, and the scope of the present invention is defined only by the appended claims, along with the full scope of equivalents to which such claims are entitled.

The embodiments of the present invention reduce the amount of circuit overhead necessary for concurrent operation. This is accomplished in various embodiments by employing common program path and sense (or read) path circuits, which allow concurrent operation of many different partitions.

Figure 3:
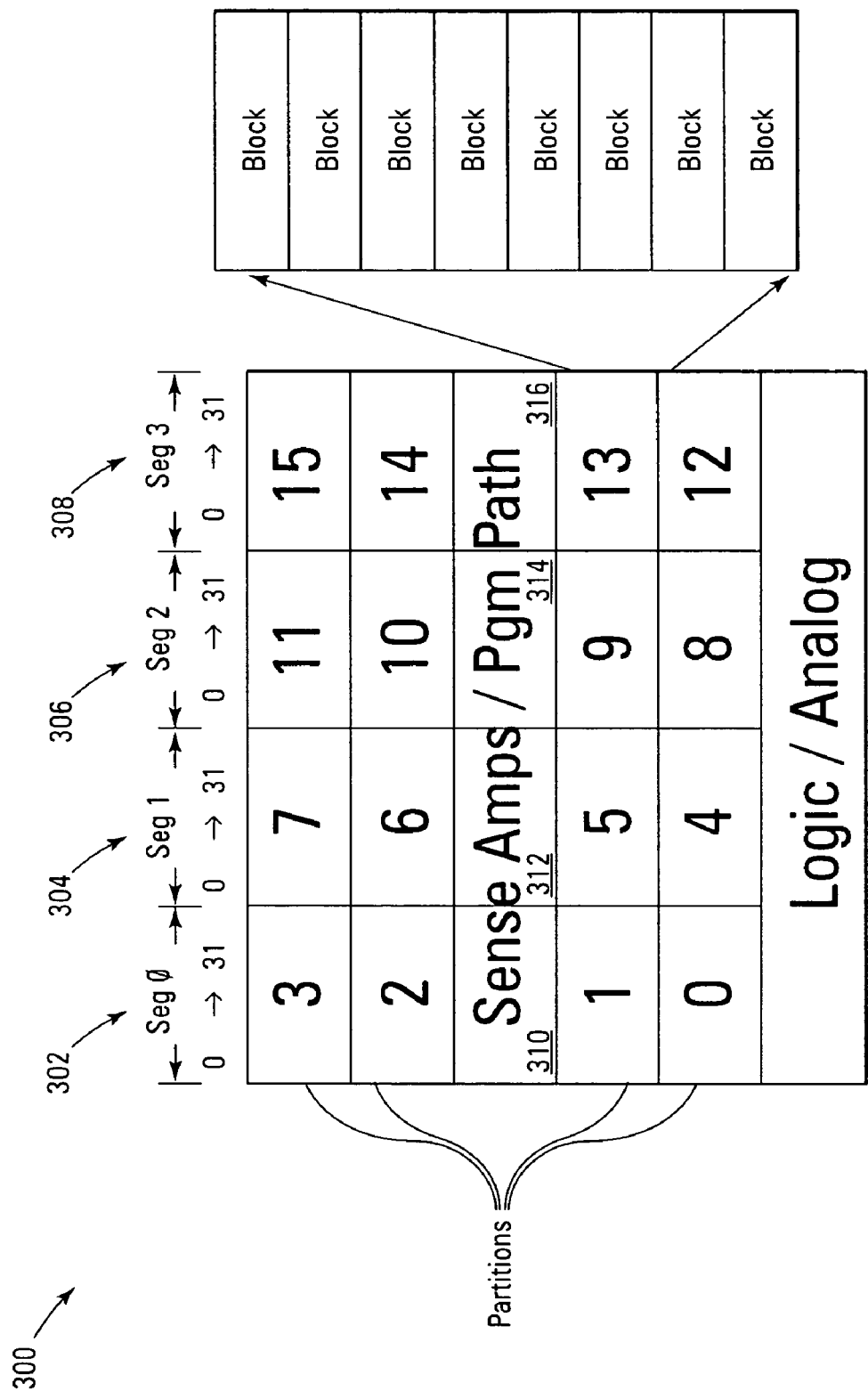
FIG. 3 is a block diagram of a partition placement according to one embodiment of the present invention.

Referring to FIG. 3, a partition placement of architectures in a memory 300 is shown. In this example, each segment 302, 304, 306, and 308 of the memory 300 has four partitions and a single program/sense amp row. Segment 302 comprises in this embodiment partitions labeled 0, 1, 2, and 3. Segment 304 comprises in this embodiment partitions labeled 4, 5, 6, and 7. Segment 306 comprises in this embodiment partitions labeled 8, 9, 10, and 11. Segment 308 comprises in this embodiment partitions labeled 12, 13, 14, and 15. Each segment 302, 304, 306, and 308 has a break between its first two and its last two segments. Each segment 302, 304, 306, and 308 has in its break, respectively, a program row 310, 312, 314, and 318, comprising in one embodiment sense amplifiers and program pathways for each of the four partitions in the segment.

Each segment (or "stack") of partitions has its own set of sense amplifiers and program pathways. In the embodiment shown, four partitions are "stacked," but it should be understood that the number of partitions "stacked" is largely dependent upon the size of the die. Any number of stacked partitions could be used. The number of partitions which can be accessed by a single program pathway/sense amp row such as rows 310, 312, 314, and 316, is limited only by the X to Y die ratio of the memory, which is defined by the packaging parameters, and by the speed required of the memory device. In various embodiments, a number of partitions numbering 2, 4, 8, 16, or 32 is concurrently accessed using the embodiments of the present invention.

The space savings of these embodiments is large, since only one set of program/sense circuits are needed where four or more were previously required. Since there is a single program/sense amp row and circuitry for multiple partitions, the circuitry can be designed with a number of features or options that previously would have been too complex and would have occupied too much real estate on the die to be feasibly incorporated into a memory. This is due to the physical number of circuits being reduced. The reduction in the number of circuits results in a much smaller impact on overall die size.

Block placement for blocks within partitions is shown in one embodiment in FIG. 4. Memory 300 is shown in FIG. 4 with the various partitions 0-15 broken down into eight main blocks for each partition. For example, blocks 24-31 comprise partition 3. It should be understood that eight blocks per partition is shown by way of example and not by way of limitation. A different number of blocks, such as 4, 16, 32 or the like is within the scope of the present invention, and is determined in part by current and changing industry specifications.

Figure 5:
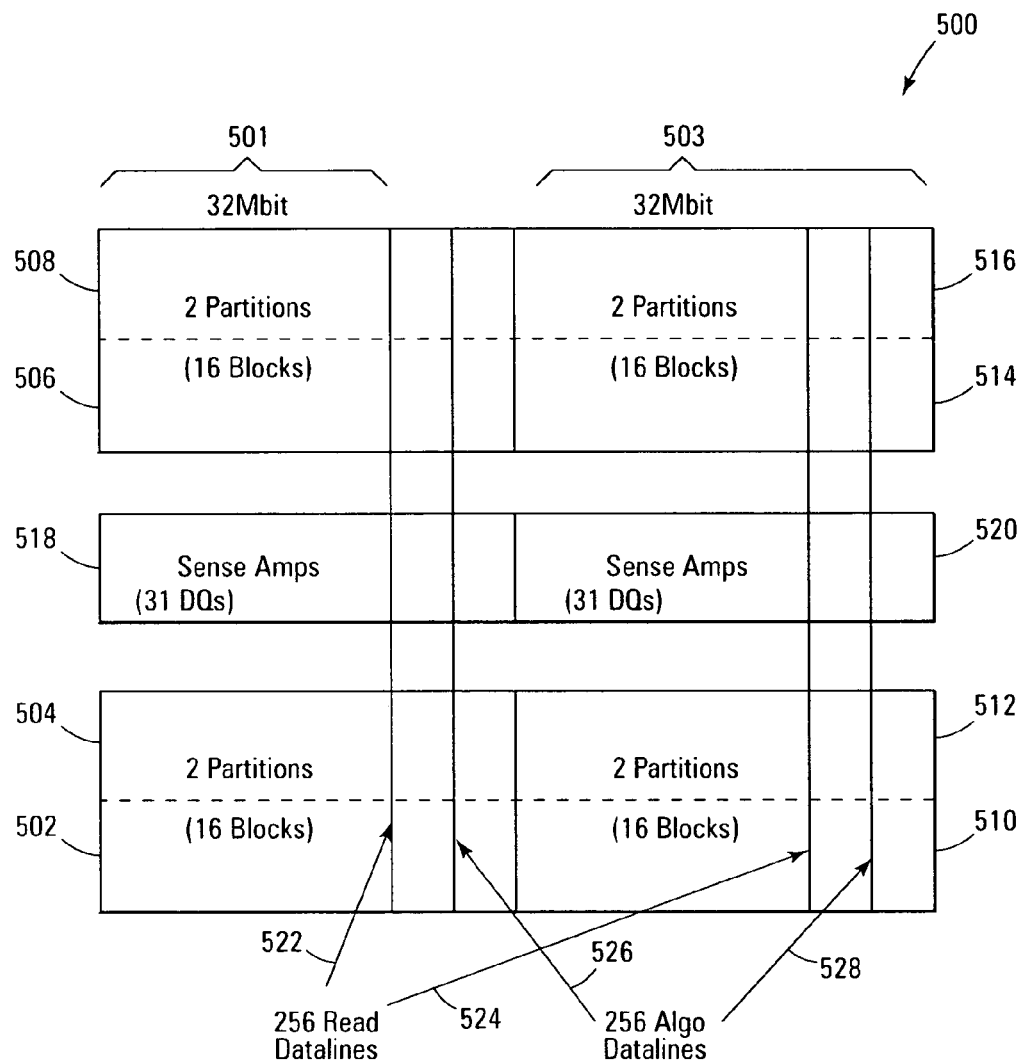
FIG. 5 is a block diagram of a portion of a memory according to another embodiment of the present invention.

To accomplish the various embodiments of the present invention, a structure such as that shown in FIG. 5 is used. FIG. 5 shows a single section 500 of a memory such as memory 300 or the like. The section 500 is in this embodiment a 64 Megabit section containing two 32 Megabit subsections 501 and 503. Subsection 501 contains four partitions 502, 504, 506, and 508, and a sense amplifier section 518 positioned between groupings of two partitions as shown. Subsection 503 contains four partitions 508, 510, 512, 514, and 516 as shown, and a sense amplifier section 520 positioned between groupings of two partitions as shown. In order to allow concurrent operations across multiple partitions, separate datalines 522 and 524 for read and datalines 526 and 528 for algorithm (or algo) modes are used, as is shown in greater detail in FIG. 5. The datalines 522, 524, 526, and 528 originate from a program/sense amplifier row (not shown) and cross a plurality of partitions. Datalines 522 and 526 cross subsection 501 and partitions 502, 504, 506, and 508; and datalines 524 and 528 cross subsection 503 and partitions 510, 512, 514, and 516. Each dataline is locally switched onto a partition's block bitline through pass gates of a particular block if the block is selected, as will be described in further detail below.

FIG. 5 shows within groups of partitions in a "stack" how spanning is accomplished for the handling of a single sense amplifier row and program row (518 and 520) for multiple partitions. Rows within partitions and blocks are independently driven, so a typical row decode for a memory is used to decode rows. Columns, however, are linked differently because the datalines for read and algorithm modes span multiple partitions. Using a common sense amplifier with multiple partitions uses datalines that span all partitions in the particular memory subsection. Datalines are dedicated to either a read or an algorithm operation, allowing independent operation of read and algorithm operations. Concurrent operations can then be performed in a single subsection provided the operations are performed in different partitions.

Figure 6:
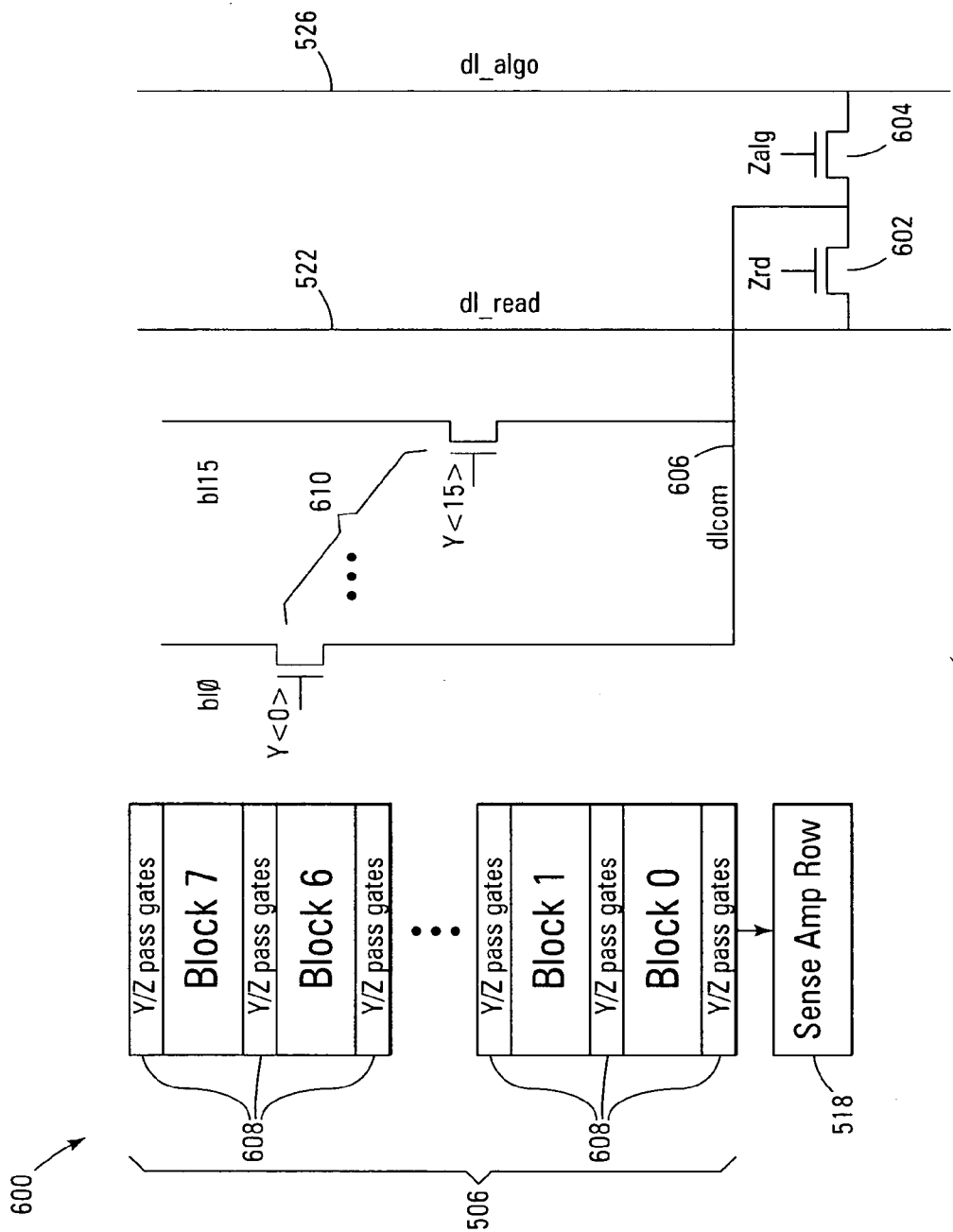
FIG. 6 is a diagram of pass gate connections to a partition according to another embodiment of the present invention.

FIG. 6 shows further detail of the connections of separate read datalines 522 and algorithm datalines 524 to blocks 0-7 within one partition, for example partition 506. Each block may be selected for read or algorithm modes as is shown in FIG. 6. If a block is selected for a read mode, it's pass gate 602 connected to a Zrd signal is turned on, that is the Zrd signal goes high. At the same time, since concurrent operations cannot happen in the same partition, the pass gate 604 connected to a Zalg signal is turned off, that is the Zalg signal goes low. In this situation, the dlcom line 606 is connected to the read dataline 522. If a block is selected for an algorithm mode, it's pass gate 604 connected to the Zalg signal is turned on, that is the Zalg signal goes high. At the same time, since concurrent operations cannot happen in the same partition, the pass gate 602 connected to the Zrd signal is turned off, that is the Zrd signal goes low. In this situation, the dlcom line 606 is connected to the algorithm dataline 526.

The pass gate select signals Zalg and Zrd are block decoded to go high only if the particular block is selected. In one embodiment, circuits inside each partition keep the Zrd signal from toggling if an algorithm is currently running in the selected block. There is a lockout based on the algorithm mode in one embodiment, so if an algorithm is running, the block is prevented from any random access. Y and Z pass gates 608 for each block decode the YZ enable of every column of the block (column decoding). The independent devices 602 and 604 are gate connected to the Zrd and Zalg signals for read and algorithm operations, respectively. Control circuitry on the gates of switches 602 and 604 have the lockouts. Drivers for the Y pass gates 610 are drivers decoded by block select and partition select in typical fashion. That allows independent Z decoding, and reads on independent datalines without disturb issues.

Figure 7:
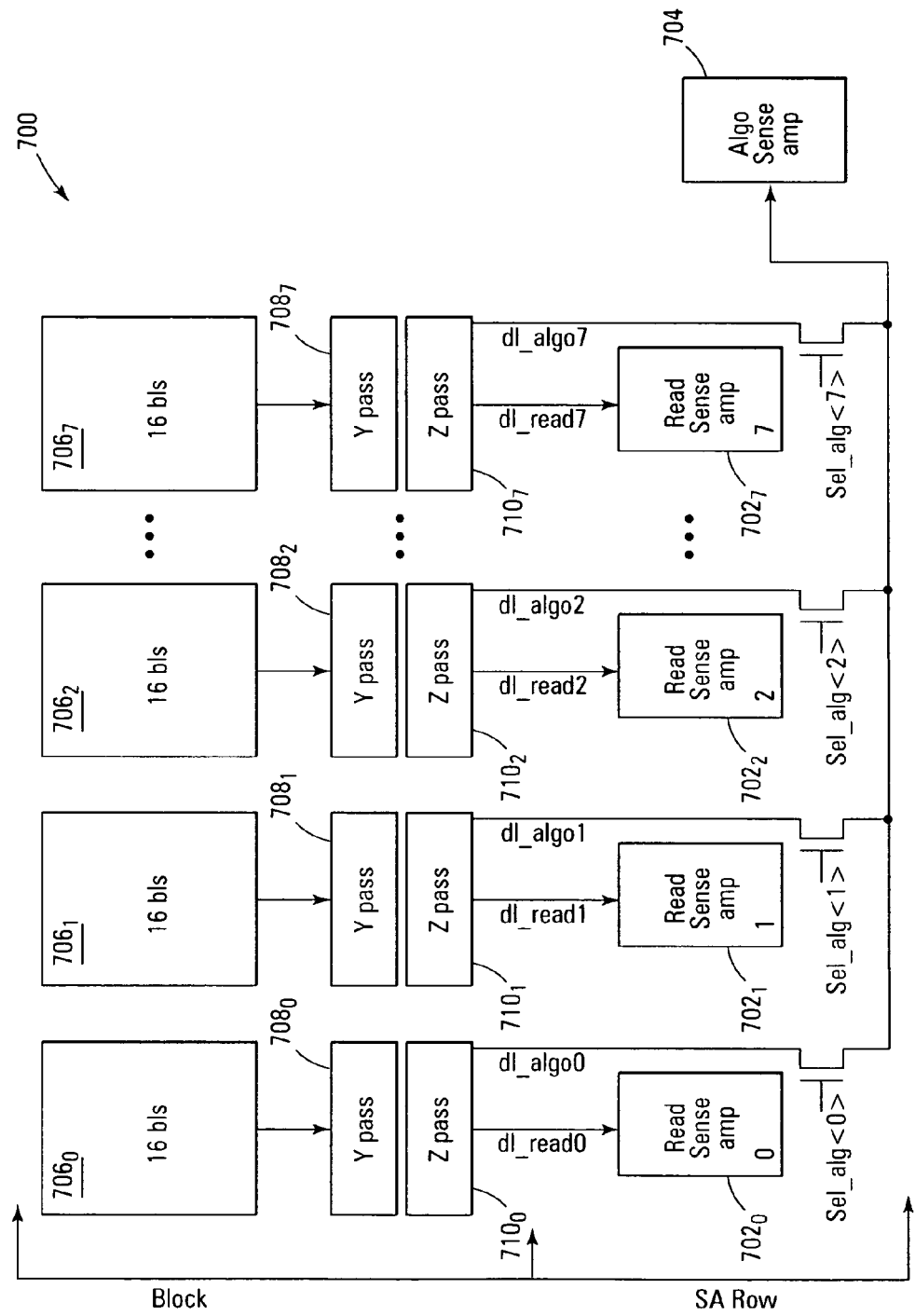
FIG. 7 is a diagram of a column decode structure according to another embodiment of the present invention.

FIG. 7 shows one embodiment 700 of a sense amplifier connection to allow simultaneous algorithm verifies and datasheet read operations. In one embodiment, the read sense amplifiers $702_0 \ldots 702_7$ are dedicated to read datalines, and one algorithm sense amplifier 704 per I/O is used for internal verifies during a program or erase operation. All circuits related to read and algorithm operations are separated and share only a common ground and supply connection. This prevents any events of one operation from affecting another operation.

FIG. 7 shows one I/O within a "stack" of multiple partitions. This is a local view of the block that is being accessed for a read operation. The grouping of 16 bitlines $706_0 \ldots 706_7$, Y pass gates $708_0 \ldots 708_7$, and Z pass gates $710_0 \ldots 710_7$ is repeated for every block top to bottom.

FIG. 7 shows a grouping of every 16 bitlines $706_0 \ldots 706_7$ connected to a grouping of Y pass gates $708_0 \ldots 708_7$, to Z pass gates $710_0 \ldots 710_7$, and then to long datalines dl_read0 ... dl_read7 that span multiple partitions into the grouping of read sense amplifiers $702_0 \ldots 702_7$. Further from the grouping of Z pass gates $710_0 \ldots 710_7$ algorithm datalines dl_alg0 ... dl_alg7 are connected to dedicated algorithm sense amplifier 704. There is one algorithm sense amplifier 704 per I/O. A group of switches $712_0 \ldots 712_7$ are connected between the Z pass gates $710_0 \ldots 710_7$ and algorithm sense amplifier 704. A single select algorithm signal in the group of signals sel_alg<0> ... sel_alg<7>, which are connected to the gates of the switches $712_0 \ldots 712_7$ respectively, is selected in this embodiment by an 8-1 multiplexor (not shown) that selects any one of the eight signals sel_alg<0> ... sel_alg<7>. The selection of one of the eight signals sel_alg<0> ... sel_alg<7> maps the selected set of bitlines $706_0 \ldots 706_7$ to the algorithm sense amplifier 704. The grouping of read datalines dl_read0 ... dl_read7 is connected to read sense amplifiers $702_0 \ldots 702_7$. It should be understood that in this embodiment, eight read sense amplifiers are shown. The number of read sense amplifiers is dependent in large part upon the specification of the memory. If the specification of the memory is different, a different number of read sense amplifiers may be used, for example in page mode where a different page size is used.

The various embodiments of the present invention are amenable to use with memory devices having concurrent operations, including flash memories and the like, and to other devices with simultaneous read and program processes.

CONCLUSION

A multi-partition architecture for concurrent operation has been described that includes using a common program path and read paths to cover multiple partitions. The use of common program path and read paths for multiple partitions reduces the amount of circuitry die size used, and allows for the maintenance of die size.

Although specific embodiments have been illustrated and described herein, it will be appreciated by those of ordinary skill in the art that any arrangement, which is calculated to achieve the same purpose, may be substituted for the specific embodiment shown. This application is intended to cover any adaptations or variations of the present invention. Therefore, it is manifestly intended that this invention be limited only by the claims and the equivalents thereof.

What is claimed:

1. A multiple partition memory architecture, comprising:
a plurality of partitions, each partition comprising a plurality of memory blocks of memory cells;
a plurality of groups of at least two partitions;
a plurality of program path and sense amplifier circuits, one common program path and sense amplifier circuit for each of the plurality of groups; and
separate pluralities of read and algorithm datalines, each of the plurality of read and algorithm datalines spanning all of one of the plurality of groups and its common program path and sense amplifier circuit.

2. The memory architecture of claim 1, and further comprising:
a plurality of read pass gates, each read pass gate selectively connectable between one of the plurality of read datalines and a bitline of a memory block.

3. The memory architecture of claim 1, and further comprising:
a plurality of algorithm pass gates, each algorithm pass gate selectively connectable between one of the plurality of algorithm datalines and a bitline of a memory block.

4. The memory architecture of claim 1, and further comprising:
a plurality of read pass gates, each read pass gate selectively connectable between one of the plurality of read datalines and a bitline of a memory block; and
a plurality of algorithm pass gates, each algorithm pass gate selectively connectable between one of the plurality of algorithm datalines and a bitline of a memory block.

5. The memory architecture of claim 1, and further comprising:
a single algorithm sense amplifier for each I/O of the memory architecture, wherein the single algorithm sense amplifier is selectively connectable to one of the algorithm datalines.

6. A flash memory architecture, comprising:
a plurality of partitions, each partition comprising a plurality of memory blocks of memory cells;
a plurality of groups of at least two partitions;
a plurality of program path and sense amplifier circuits, one common program path and sense amplifier circuit for each of the plurality of groups; and
separate pluralities of read and algorithm datalines, each of the plurality of read and algorithm datalines spanning all of one of the plurality of groups and its common program path and sense amplifier circuit.

7. The memory architecture of claim 6, and further comprising:
a plurality of read pass gates, each read pass gate selectively connectable between one of the plurality of read datalines and a bitline of a memory block.

8. The memory architecture of claim 6, and further comprising:
a plurality of algorithm pass gates, each algorithm pass gate selectively connectable between one of the plurality of algorithm datalines and a bitline of a memory block.

9. The memory architecture of claim 6, and further comprising:
a plurality of read pass gates, each read pass gate selectively connectable between one of the plurality of read datalines and a bitline of a memory block; and
a plurality of algorithm pass gates, each algorithm pass gate selectively connectable between one of the plurality of algorithm datalines and a bitline of a memory block.

10. The memory architecture of claim 6, and further comprising:
a single algorithm sense amplifier for each I/O of the memory architecture, wherein the single algorithm sense amplifier is selectively connectable to one of the algorithm datalines.

11. The memory architecture of claim 6, wherein the non-volatile memory cells are floating gate memory cells.

12. A flash memory, comprising:
an array of non-volatile memory cells having a multiple partition memory architecture, comprising:
a plurality of partitions, each partition comprising a plurality of memory blocks of memory cells;
a plurality of groups of at least two partitions; and
control circuitry to read, write and erase the memory cells, wherein the control circuitry further comprises:
a plurality of program path and sense amplifier circuits, one common program path and sense amplifier circuit for each of the plurality of groups; and separate pluralities of read and algorithm datalines, each of the plurality of read and algorithm datalines spanning all of one of the plurality of groups and its common program path and sense amplifier circuit.

13. The memory of claim 12, and further comprising:
a plurality of read pass gates, each read pass gate selectively connectable between one of the plurality of read datalines and a bitline of a memory block.

14. The memory of claim 12, and further comprising:
a plurality of algorithm pass gates, each algorithm pass gate selectively connectable between one of the plurality of algorithm datalines and a bitline of a memory block.

15. The memory of claim 12, and further comprising:
a plurality of read pass gates, each read pass gate selectively connectable between one of the plurality of read datalines and a bitline of a memory block; and
a plurality of algorithm pass gates, each algorithm pass gate selectively connectable between one of the plurality of algorithm datalines and a bitline of a memory block.

16. The memory of claim 12, and further comprising:
a single algorithm sense amplifier for each I/O of the memory architecture, wherein the single algorithm sense amplifier is selectively connectable to one of the algorithm datalines.

17. A method of concurrent memory operation, comprising:
providing a memory divided into a plurality of partitions, each partition comprising a plurality of memory blocks;
arranging the partitions into a plurality of groups of at least two partitions;
providing a plurality of program path and sense amplifier circuits, one common program path and sense amplifier circuit for each of the plurality of groups;
providing separate pluralities of read and algorithm datalines, each of the plurality of read and algorithm datalines spanning all of one of the plurality of groups and its common program path and sense amplifier circuit; and
allowing a concurrent operation on any partition not already in operation.

18. The method of claim 17, and further comprising:
providing a plurality of read pass gates, each read pass gate selectively connectable between one of the plurality of read datalines and a bitline of a memory block.

19. The method of claim 17, and further comprising:
providing a plurality of algorithm pass gates, each algorithm pass gate selectively connectable between one of the plurality of algorithm datalines and a bitline of a memory block.

20. The method of claim 17, and further comprising:
providing a plurality of read pass gates, each read pass gate selectively connectable between one of the plurality of read datalines and a bitline of a memory block; and
providing a plurality of algorithm pass gates, each algorithm pass gate selectively connectable between one of the plurality of algorithm datalines and a bitline of a memory block.

21. The method of claim 20, wherein allowing a concurrent operation comprises:
preventing toggling of the read pass gate for any block in the memory currently running an algorithm process.

22. The memory of claim 17, and further comprising:
providing a single algorithm sense amplifier for each I/O of the memory architecture, wherein the single algorithm sense amplifier is selectively connectable to one of the algorithm datalines.

23. A method of reducing circuit overhead in a multiple partition memory, comprising:
providing a memory divided into a plurality of partitions;
arranging the partitions into a plurality of groups of at least two partitions;
providing a plurality of program path and sense amplifier circuits, one common program path and sense amplifier circuit for each of the plurality of groups;
providing separate pluralities of read and algorithm datalines, each of the plurality of read and algorithm datalines spanning all of one of the plurality of groups and its common program path and sense amplifier circuit; and
allowing a concurrent operation on any partition not already in operation.

24. A processing system, comprising:
a processor; and
a memory coupled to the processor to store data provided by the processor and to provide data to the processor, the memory comprising:
an array of memory cells addressable by address circuitry and input output circuitry,
having a multiple partition memory architecture, comprising:
a plurality of partitions of memory cells;
a plurality of groups of at least two partitions; and
control circuitry to read, write and erase the memory cells;
wherein the control circuitry further comprises:
a plurality of program path and sense amplifier circuits, one common program path and sense amplifier circuit for each of the plurality of groups; and
separate pluralities of read and algorithm datalines, each of the plurality of read and algorithm datalines spanning all of one of the plurality of groups and its common program path and sense amplifier circuit.

25. A memory device comprising:
an array of memory cells having a multiple partition memory architecture, comprising:
a plurality of partitions of memory cells;
a plurality of groups of at least two partitions; and
control circuitry to read, write and erase the memory cells;
wherein the control circuitry further comprises:
a plurality of program path and sense amplifier circuits, one common program path and sense amplifier circuit for each of the plurality of groups; and
separate pluralities of read and algorithm datalines, each of the plurality of read and algorithm datalines spanning all of one of the plurality of groups and its common program path and sense amplifier circuit.

* * * * *

UNITED STATES PATENT AND TRADEMARK OFFICE
CERTIFICATE OF CORRECTION

PATENT NO. : 8,233,322 B2  Page 1 of 1
APPLICATION NO. : 10/683075
DATED : July 31, 2012
INVENTOR(S) : Theodore T. Pekny et al.

It is certified that error appears in the above-identified patent and that said Letters Patent is hereby corrected as shown below:

In column 8, line 5, in Claim 22, delete "memory" and insert -- method --, therefor.

Signed and Sealed this
Twenty-fifth Day of September, 2012

David J. Kappos
*Director of the United States Patent and Trademark Office*